United States Patent
Hoffman et al.

(10) Patent No.: US 6,919,631 B1
(45) Date of Patent: *Jul. 19, 2005

(54) STRUCTURES FOR IMPROVING HEAT DISSIPATION IN STACKED SEMICONDUCTOR PACKAGES

(75) Inventors: Paul Robert Hoffman, Chandler, AZ (US); David Albert Zoba, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/771,072

(22) Filed: Feb. 2, 2004

Related U.S. Application Data

(62) Division of application No. 10/013,396, filed on Dec. 7, 2001, now Pat. No. 6,737,750.

(51) Int. Cl.[7] .......................... H01L 23/10; H01L 23/34
(52) U.S. Cl. ....................................... 257/707; 257/686
(58) Field of Search ................................ 257/706, 707, 257/686, 777, 698, 784, 778, 787

(56) References Cited

U.S. PATENT DOCUMENTS

| | | | |
|---|---|---|---|
| 4,763,188 A | 8/1988 | Johnson ........................ | 357/74 |
| 5,012,323 A | 4/1991 | Farnworth ..................... | 357/75 |
| 5,025,306 A | 6/1991 | Johnson et al. ................ | 357/75 |
| 5,041,902 A | 8/1991 | McShane | |
| 5,166,772 A | 11/1992 | Soldner et al. ............. | 257/659 |
| 5,200,809 A | 4/1993 | Kwon ......................... | 257/707 |
| 5,291,061 A | 3/1994 | Ball ........................... | 257/686 |
| 5,323,060 A | 6/1994 | Fogal et al. ................. | 257/777 |
| 5,328,870 A | 7/1994 | Marrs | |
| 5,347,429 A | 9/1994 | Kohno et al. ............... | 361/813 |
| 5,355,283 A | 10/1994 | Marrs et al. | |

(Continued)

FOREIGN PATENT DOCUMENTS

| | | | | |
|---|---|---|---|---|
| EP | 503 201 A2 | 12/1991 | ......... | H01L/23/495 |
| JP | 56062351 | 5/1981 | .......... | H01L/25/04 |
| JP | 60182731 | 9/1985 | .......... | H01L/21/60 |
| JP | 61117858 | 6/1986 | .......... | H01L/25/08 |

(Continued)

*Primary Examiner*—S. V. Clark
(74) *Attorney, Agent, or Firm*—Gunnison, McKay & Hodgson, L.L.P.; Serge J. Hodgson

(57) ABSTRACT

Semiconductor packages including at least two semiconductor dies are disclosed. A first die is mounted on a substrate, which may be a metallized laminate or a leadframe. A rigid support structure is mounted on the substrate over the first die. The support structure may be thermally coupled to the substrate, and also may be electrically coupled to the substrate. A second die is mounted on the support structure, which spaces the second die away from the first die. Encapsulant fills the volume within the support structure, including the vertical space between the pair of dies. In an alternative package embodiment, a heat spreader formed of a flexible metal sheet may be thermally coupled between the two stacked dies. The heat spreader transfers heat from the first and second dies to a heat sink of the substrate. The support structure and the heat spreader mitigate the transfer of heat between the first and second dies.

24 Claims, 10 Drawing Sheets

U.S. PATENT DOCUMENTS

| | | | |
|---|---|---|---|
| 5,365,107 A | 11/1994 | Kuraishi et al. | 257/673 |
| 5,381,042 A | 1/1995 | Lerner et al. | |
| 5,410,451 A * | 4/1995 | Hawthorne et al. | 361/760 |
| 5,422,435 A | 6/1995 | Takiar et al. | 174/52.4 |
| 5,455,462 A | 10/1995 | Marrs | |
| 5,463,253 A | 10/1995 | Waki et al. | 257/724 |
| 5,471,011 A | 11/1995 | Maslakow | |
| 5,478,007 A | 12/1995 | Marrs | |
| 5,482,898 A | 1/1996 | Marrs | |
| 5,485,037 A | 1/1996 | Marrs | |
| 5,495,398 A | 2/1996 | Takiar et al. | 361/790 |
| 5,502,289 A | 3/1996 | Takiar et al. | 174/266 |
| 5,530,202 A | 6/1996 | Dais et al. | 174/35 R |
| 5,583,378 A | 12/1996 | Marrs et al. | |
| 5,616,957 A | 4/1997 | Kajihara | |
| 5,629,561 A | 5/1997 | Shin et al. | |
| 5,650,593 A | 7/1997 | McMillan et al. | |
| 5,650,663 A | 7/1997 | Parthasarathi | |
| 5,656,864 A | 8/1997 | Mitsue et al. | 257/787 |
| 5,689,135 A | 11/1997 | Ball | 257/676 |
| 5,696,031 A | 12/1997 | Wark | 437/209 |
| 5,701,034 A | 12/1997 | Marrs | |
| 5,708,567 A | 1/1998 | Shim et al. | |
| 5,715,147 A | 2/1998 | Nagano | 361/813 |
| 5,721,452 A | 2/1998 | Fogal et al. | 257/685 |
| 5,722,161 A | 3/1998 | Marrs | |
| 5,723,899 A | 3/1998 | Shin | |
| 5,739,581 A | 4/1998 | Chillara et al. | 257/668 |
| 5,783,860 A | 7/1998 | Jeng et al. | |
| 5,793,108 A | 8/1998 | Nakahishi et al. | 257/723 |
| 5,807,768 A | 9/1998 | Shin | |
| 5,815,372 A | 9/1998 | Gallas | 361/760 |
| 5,854,511 A | 12/1998 | Shin et al. | |
| 5,866,949 A | 2/1999 | Schueller | 257/778 |
| 5,886,412 A | 3/1999 | Fogal et al. | 257/777 |
| 5,929,513 A | 7/1999 | Asano et al. | |
| 5,929,514 A | 7/1999 | Yalamanchili | |
| 5,973,403 A | 10/1999 | Wark | 257/777 |
| 5,977,626 A | 11/1999 | Wang et al. | |
| 5,985,695 A | 11/1999 | Freyman et al. | |
| 6,005,778 A | 12/1999 | Spielberger et al. | 361/770 |
| 6,008,991 A | 12/1999 | Hawthorne et al. | |
| 6,028,354 A | 2/2000 | Hoffman | |
| RE36,613 E | 3/2000 | Ball | 257/777 |
| 6,040,626 A | 3/2000 | Cheah et al. | |
| 6,051,886 A | 4/2000 | Fogal et al. | 257/777 |
| 6,057,598 A | 5/2000 | Payne et al. | 257/723 |
| 6,069,023 A | 5/2000 | Bernier et al. | |
| 6,072,243 A | 6/2000 | Nakanishi | 257/783 |
| 6,080,264 A | 6/2000 | Ball | 156/292 |
| 6,093,960 A | 7/2000 | Tao et al. | |
| 6,133,637 A | 10/2000 | Hikita et al. | 257/777 |
| 6,166,446 A | 12/2000 | Masaki | |
| 6,198,163 B1 | 3/2001 | Crowley et al. | |
| 6,214,641 B1 | 4/2001 | Akram | 438/107 |
| 6,229,204 B1 | 5/2001 | Hembree | |
| 6,229,702 B1 | 5/2001 | Tao et al. | |
| 6,246,115 B1 | 6/2001 | Tang et al. | 257/706 |
| 6,258,629 B1 | 7/2001 | Niones et al. | |
| 6,326,696 B1 | 12/2001 | Horton et al. | 257/777 |
| 6,400,014 B1 | 6/2002 | Huang et al. | |
| 6,429,512 B1 | 8/2002 | Huang et al. | 257/706 |
| 6,507,098 B1 * | 1/2003 | Lo et al. | 257/686 |
| 6,603,072 B1 * | 8/2003 | Foster et al. | 174/52.4 |
| 6,650,006 B2 * | 11/2003 | Huang et al. | 257/686 |
| 6,737,750 B1 * | 5/2004 | Hoffman et al. | 257/777 |
| 2002/0109226 A1 | 8/2002 | Khan et al. | |

FOREIGN PATENT DOCUMENTS

| | | | |
|---|---|---|---|
| JP | 62126661 | 6/1987 | H01L/25/04 |
| JP | 62-126661 | 6/1987 | H01L/25/04 |
| JP | 63128736 | 6/1988 | H01L/23/04 |
| JP | 63-244654 | 10/1988 | H01L/23/28 |
| JP | 1028856 | 1/1989 | H01L/27/00 |
| JP | 64001269 | 1/1989 | H01L/25/04 |
| JP | 1071162 A | 3/1989 | H01L/23/52 |
| JP | 1099248 A | 4/1989 | H01L/25/08 |
| JP | 3169062 | 7/1991 | H01L/25/065 |
| JP | 4028260 | 1/1992 | H01L/25/065 |
| JP | 4-56262 | 2/1992 | H01L/25/65 |
| JP | 4056262 | 2/1992 | H01L/25/065 |
| JP | 4096358 | 3/1992 | H01L/25/065 |
| JP | 4116859 | 4/1992 | H01L/25/065 |
| JP | 5013665 | 1/1993 | H01L/25/065 |
| JP | 5-75015 A | 3/1993 | H01L/25/065 |
| JP | 5109975 | 4/1993 | H01L/25/065 |
| JP | 5136323 | 6/1993 | H01L/23/50 |
| JP | 10-256470 | 9/1998 | H01L/25/065 |

* cited by examiner

STRUCTURES FOR IMPROVING HEAT DISSIPATION IN STACKED SEMICONDUCTOR PACKAGES

CROSS-REFERENCE TO RELATED APPLICATION

This application is a division of U.S. patent application Ser. No. 10/013,396, filed on Dec. 7, 2001, now U.S. Pat. No. 6,737,750, issued on May 18, 2004, and incorporated herein by reference in its entirety.

BACKGROUND

1. Field of the Invention

The present invention relates to a semiconductor package and a method for fabricating a semiconductor package.

2. Related Art

Semiconductor packages that include stacked semiconductor dies (otherwise known as semiconductor "chips" or "integrated circuits") are becoming increasingly popular. Such packages allow dies that perform the same function (e.g., two memory dies) or different functions (e.g., a processor die and a memory die) to be combined into a single package. This improves density and is especially useful in applications where package size is important, such as in cell phones, PDAs, camcorders, and other wireless consumer products.

Conventional stacked semiconductor packages typically include a substrate, such as a leadframe, tape, or laminate substrate, upon which a pair of dies are mounted. A bottom die is attached by an adhesive layer to a mounting area on a surface of the substrate. A top die is attached to the bottom die with an adhesive layer.

One disadvantage of stacked semiconductor packages is that it is difficult to effectively dissipate the heat generated by the top and bottom dies. For example, heat generated by the top die flows from the top die through the adhesive layer into the bottom die. This raises the temperature of the bottom die and thus can degrade the performance of the bottom die.

What is needed is a semiconductor package for plural dies with improved thermal

SUMMARY

In one embodiment of the present invention, a semiconductor package is provided. The semiconductor package includes a substrate having a first surface. A first die is mounted on the first surface of the substrate. A free-standing, rigid support structure having at least one aperture formed therein is disposed over the first die on the first surface of substrate. A second die is mounted on the support structure. An encapsulant fills within the support structure and covers the first die, the support structure, and the second die. Both the first and second dies are electrically connected to circuit patterns on the first surface of the substrate. The support structure may be thermally coupled to the substrate, thereby providing heat transfer from the second die, and also may be electrically coupled to a circuit pattern of the first surface of the substrate, thereby providing a voltage to the inactive backside of the second die and/or a voltage input to the second die.

In another embodiment of the present invention, a semiconductor package includes a substrate having a first surface. A first die is in a flip chip connection with a plurality of circuit patterns on the first surface of the substrate. A thermally conductive first heat spreader having a first surface and an opposite second surface is disposed over the first die and is thermally coupled between the inactive backside of the first die and the substrate. The inactive backside of a second die is mounted on and is thermally coupled to the first heat spreader over the first die. The second die may be electrically connected to circuit patterns of the first surface of the substrate by wires that extend through openings in the heat spreader. A second heat spreader may be provided over the second die and the first heat spreader, and may be thermally coupled between the second die and either the substrate or the first heat spreader.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

Figure 1:
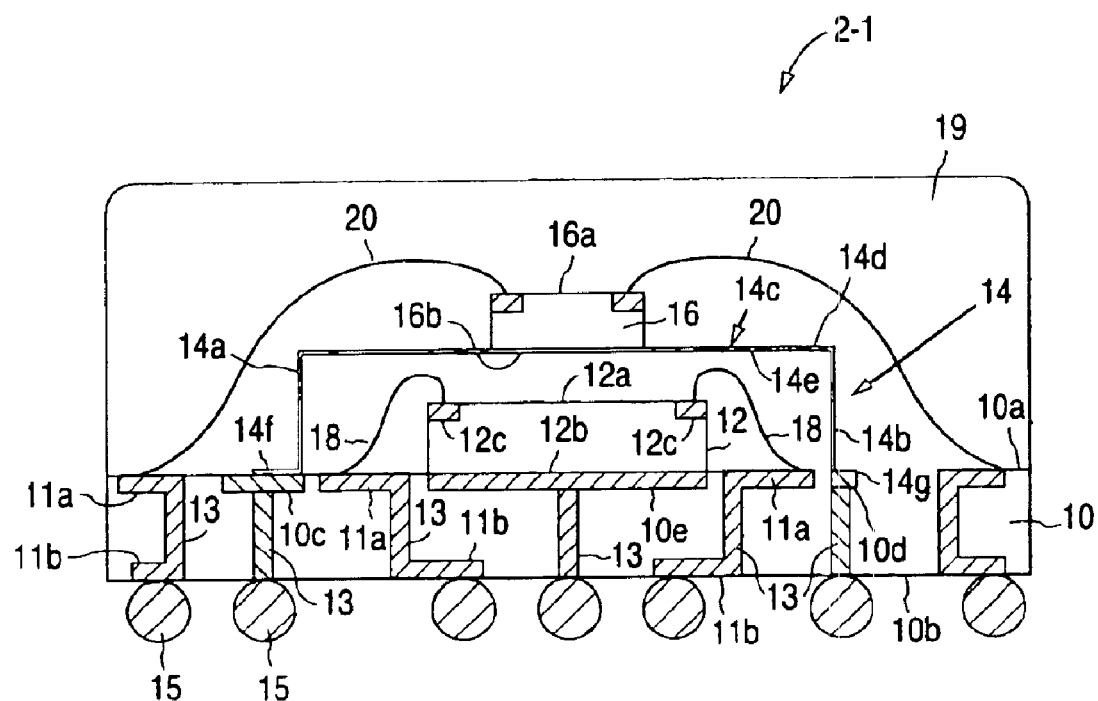
FIG. 1 is a cross-sectional side view of a semiconductor package including a support structure, according to one embodiment of the present invention.

FIG. 1 is a cross-sectional view of a semiconductor package 2-1 including a support structure 14, according to one embodiment of the present invention. Semiconductor package 2-1 includes a rectangular substrate 10 having an upward-facing first surface 10a and an opposite downward-facing second surface 10b. A rectangular first die 12 having an upward-facing active first surface 12a and an opposing downward-facing inactive second surface 12b is mounted on a metal die pad 10e of first surface 10a. Die pad 10e may be thermally coupled by a via 13 to a conductive ball 15 on second surface 10b substrate 10 to transfer heat from first die 12, and also may be electrically coupled (sometimes also stated as "electrically connected" herein) through those structures to an external reference voltage so as to provide the voltage to second surface 12b of first die 12.

A free-standing support structure 14 superimposes first die 12 and includes a vertically oriented first side 14a, an opposite vertically oriented second side 14b, and a horizontally oriented top side 14c that is connected at right angles to first and second sides 14a, 14b. Topside 14c includes an upward-facing first surface 14d and an opposite downward-facing second surface 14e.

In this embodiment, support structure 14 is generally rectangular in cross-section, but can have any shape. Typically, the corners are rounded, e.g., for ease of encapsulation. A rectangular second die 16 that is smaller in horizontal area than first die 12 is mounted on first surface 14d of top side 14c. Second die 16 has an upward-facing active first surface 16a and an opposing downward-facing inactive second surface 16b. Support structure 14 can also have two additional vertically oriented sides (not visible in this cross-sectional view), and thus, may have a total of four vertically oriented sides.

Support structure 14 may include a plurality of horizontal feet 14f as a base that rest on and are thermally coupled (e.g. by solder or a thermally conductive adhesive) to heat sinks accessible at first surface 10a of substrate 10. The heat sink of substrate 10 may include metal or other thermally conductive regions 10c on first surface 10a that are thermally coupled to feet 14f. Conductive regions 10c, in turn, are thermally coupled by conductive vias 13 to conductive balls 15 on second surface 10b of substrate 10, or to an intermediate metal heat sink layer within substrate 10 (not shown). Alternatively, instead of having feet 14f, support structure 14 may include pins 14g that extend into precisely-located holes 10d in first surface 10a of substrate 10 for thermal coupling therein to vias 13 and conductive balls 15.

Substrate 10 may include an insulative core layer with a layer of conductive first circuit patterns 11a on first surface 10a, and layer of conductive second circuit patterns 11b on second surface 10b. A layer of an insulative protective solder mask material covers portions of the circuit patterns 11a, 11b. While typically there will be many of the first and second circuit patterns 11a, 11b, only a few of them are shown in FIG. 1 for clarity of view. Respective first and second circuit patterns 11a, 11b are electrically interconnected by respective electrically conductive vias 13 that extend vertically through substrate 10.

The core layer of substrate 10 may be composed of any type of package substrate material, such as glass fiber-filled epoxy laminate, ceramic, insulated metal, or polyimide. First and second circuit patterns 11a and 11b, die pad 10f, conductive regions 10c, and vias 13 may be formed of patterned metal (e.g., copper). Interconnection balls 15 may be fused to respective second circuit patterns 11b to serve as input/output terminals for package 2-1, and/or directly to the lower and of the vias 13 to conduct heat to an external motherboard.

First surface 12a of first die 12 includes a plurality of peripheral input/output terminals, called bond pads 12c herein, along two or four sides of first surface 12a. In other embodiments (not shown), bond pads 12c can be located at other portions of first surface 12a, such as in the central portion of first surface 12a. Bond pads 12c are electrically connected within support structure 14 to respective ones of the plurality of first circuit patterns 11a on first surface 10a of substrate 10 via conductive wires 18. Second surface 12b of first die 12 can be affixed to die pad 10e of first surface 10a of substrate 10 using a thermally and/or electrically conductive adhesive. Alternatively, first die 12 can be electrically connected to first circuit patterns 11a in a flip-chip connection, thereby eliminating wires 18.

First surface 16a of second die 16 also includes a plurality of bond pads 16c located near the perimeter of first surface 16a along two or four sides of second die 16. In other embodiments (not shown), bond pads 16c can be located at other portions of first surface 15a, such as in the central portion of first surface 15a. Bond pads 16c are electrically connected to circuit patterns 11a that are located outside of support structure 14 via respective conductive wires 20. Second surface 16b of second die 16 is affixed to first surface 14d of support structure 14 using a thermally conductive adhesive. In this embodiment, second die 16 is smaller in horizontal area than either first surface 14d of support structure 14 or first die 12.

Support structure 14 can be formed using many different materials. In some embodiments, support structure 14 is formed of a thermally conductive metal material, such as copper or aluminum. In other embodiments, support structure 14 is formed of a thermally conductive plastic or composite material. Support structure 14 can be rigid or fairly rigid. With second die 16 thermally coupled to support structure 14, support structure 14 provides a path to conduct heat from second die 16 to a heat sink of substrate 10. Accordingly, package 2-1 has thermal advantages over conventional packages where a pair of dies are stacked one directly on the other, in which case heat from one of the stacked dies can flow into the other. In package 2-1, heat from second die 16 is thermally conducted by support structure 14 to substrate 10 rather than to first die 12.

A protective insulative unitary body of a hardened encapsulant 19 may be provided over first die 12, conductive wires 18, support structure 14, second die 16, conductive wires 20, and all or a sub-portion of first surface 10a of substrate 10 by molding or pouring a resin compound, such as epoxy, over substrate 10. Since, as mentioned, support structure 14 includes one or more holes in its surfaces, e.g. through first or second sides 14a, 14b or top side 14c, encapsulant 19 flows through the holes in support structure 14 during the encapsulation process, so as to cover first die 12 and conductive wires 18 with encapsulant 19 and fill the volume within support structure 14 with encapsulant 19. As an alternative to using encapsulant 19, a pre-formed protective cap or lid (not shown) made of metal or plastic can be mounted on first surface 10a of substrate 10 and used to cover first die 12, conductive wires 18, support structure 14, second die 16, conductive wires 20, and all or a sub-portion of first surface 10a.

Covering first die 12 and conductive wires 18 with encapsulant 19 and filling the remaining volume within support structure 14 with encapsulant 19 can be advantageous for at least the following reasons. First, encapsulant 19 acts as a moisture barrier keeping moisture from contacting first die 12 and conductive wires 18, as well as support structure 14, second die 16, conductive wires 20, and a portion of first surface 10a of substrate 10. Second, encapsulant 19 increases the overall strength and physical integrity of semiconductor package 2-1. Third, encapsulant 19 helps to ensure that semiconductor package 2-1 will not be damaged when exposed to different solder reflow temperatures.

In an alternative embodiment, a support structure having no apertures (not shown) may be provided to prevent the encapsulant from covering first die 12. This type of support structure may be hermetically sealed to first surface 10a of substrate 10 such that an air pocket is formed within the support structure and is maintained even after the support structure itself is encapsulated. Of course, the substrate, support structure, encapsulant material, and assembly process/temperatures would need to be selected so that unduly high pressures do not develop within the air pocket during the assembly process to avoid damaging (e.g., cracking) the semiconductor package.

Practitioners will appreciate that the configuration and type of substrate 10 may vary. For instance, package 2-1 is shown as a ball grid array (BGA) package, but conductive balls 15 may be omitted so that package 2-1 is a land grid array (LGA) package. Further, while the example substrate 10 includes a core insulative layer with layers of metal on the opposed surfaces thereof, substrate 10 is not limited to such a structure. For instance, substrate 10 may be a thin film substrate or a rigid metal leadframe having a die pad and radiating metal leads.

Figure 2:
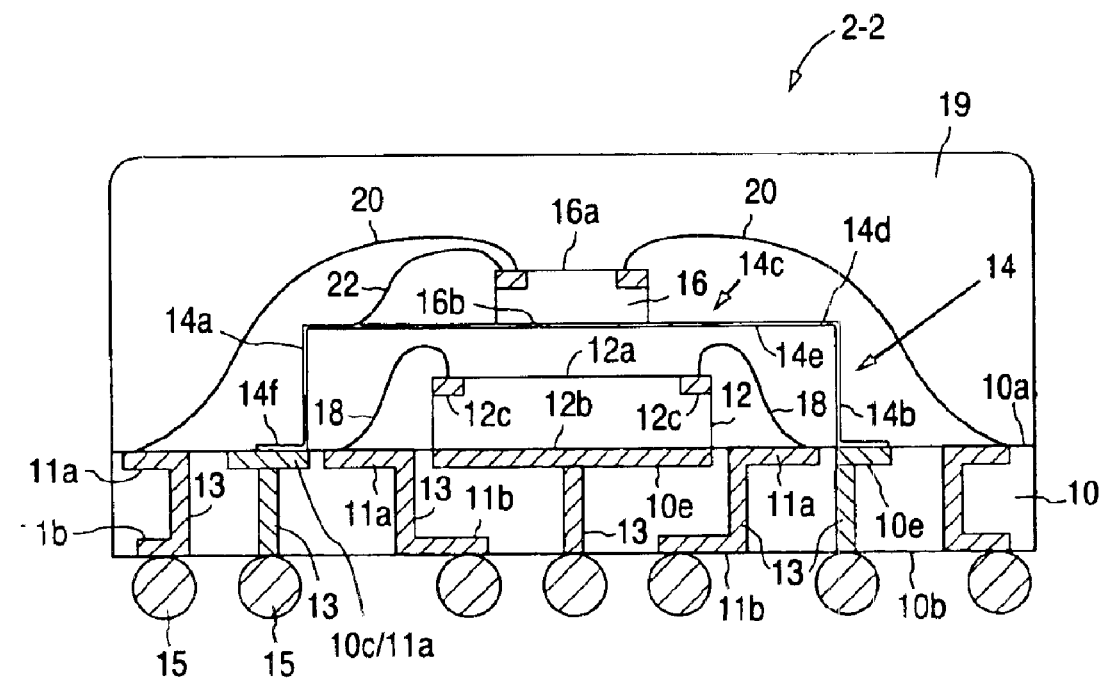
FIG. 2 is a cross-sectional side view of a semiconductor package including a support structure that is electrically connected to a die via a wire, according to one embodiment of the present invention.

FIG. 2 is a cross-sectional side view of a semiconductor package 2-2, according to another embodiment of the present invention. Semiconductor package 2-2 includes a metal support structure 14 that is electrically connected to at least one bond pad 16c of second die 16 via a conductive metal wire 22. For instance, wire 22 can be electrically connected to a bond pad 16c that is a ground terminal or some other reference voltage terminal of second die 16. An opposite end of bond wire 22 may be electrically connected to an exposed electrically conductive portion of first surface 14d of top side 14c of support structure 14. Support structure 14, in turn, may be electrically connected through conductive regions 10c or a first circuit pattern 11a on first surface 10a of substrate 10, a via 13 and a conductive ball 15 to a ground or voltage source on a motherboard on which package 2-2 is mounted. In this manner, support structure 14 itself, or a conductive portion thereof, can be part of a conductive path that provides a ground or other reference voltage to a bond pad 16c of second die 16.

In an alternative embodiment, an electrically conductive die attach paste can be used to attach second surface 16b of second die 16 to an electrically conductive portion of first surface 14d of top side 14c of support structure 14 to provide a ground or other reference voltage to the inactive second surface 16b of second die 16.

Figure 3:
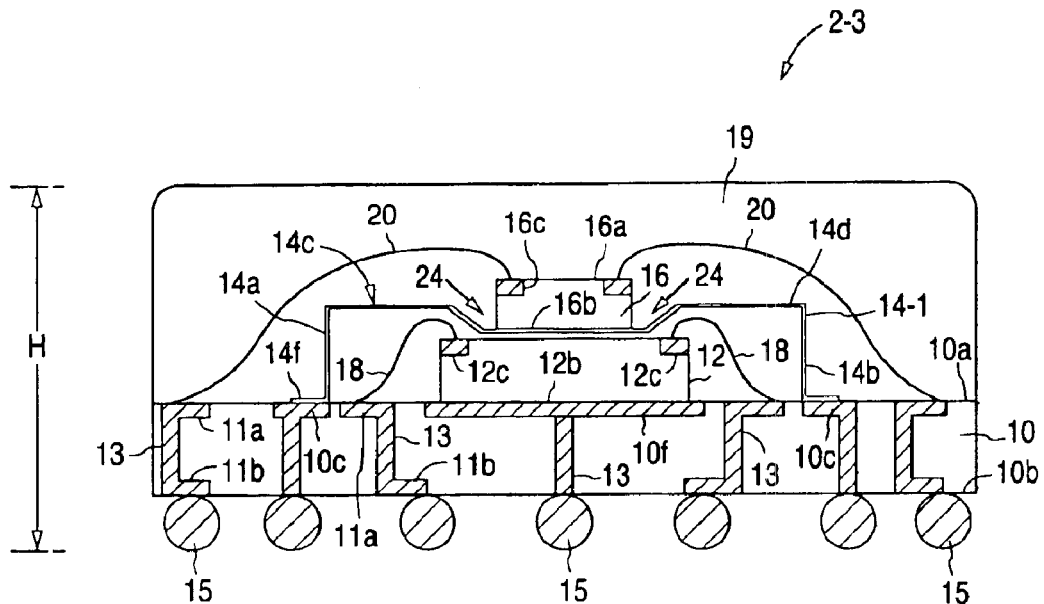
FIG. 3 is a cross-sectional side view of a semiconductor package including a support structure having a recess formed therein, according to one embodiment of the present invention.

FIG. 3 shows a cross-sectional view of a semiconductor package 2-3, according to another embodiment of the present invention. Semiconductor package 2-3 includes a support structure 14-1 that has a recess 24 formed in a central portion of first surface 14d of top side 14c. Recess 24 includes two downwardly sloping walls that taper into a central flat portion. Second die 16 is disposed on the central flat portion of first surface 14d within recess 24. An advantage of this embodiment is that, by disposing second die 16 in recess 24, the overall height H of semiconductor package 2-3 can be reduced by an amount equal to the depth of recess 24. In one embodiment, recess 24 may be stamped into a metal support structure 14-1. A recess 24 may be provided in various other of the support structures discussed herein.

Figure 4:
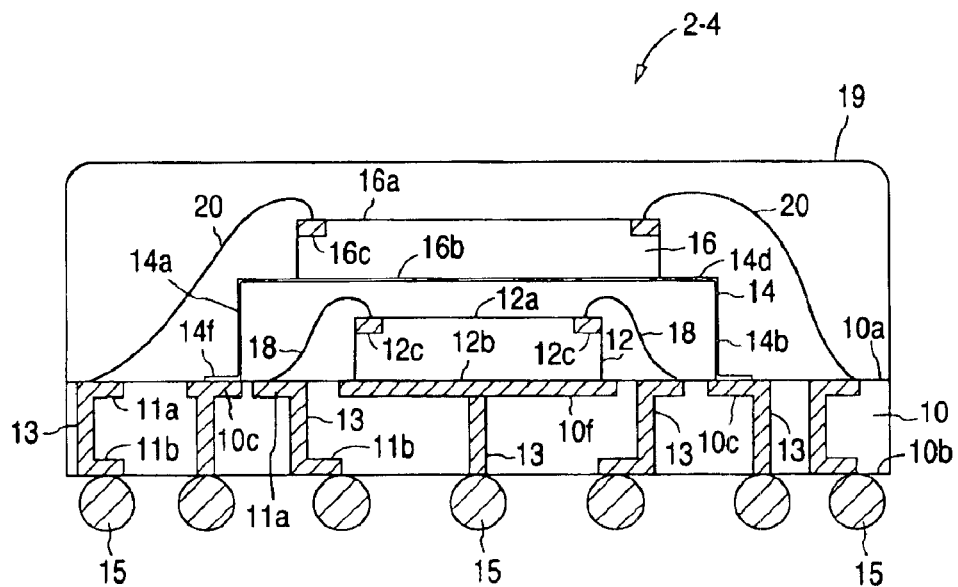
FIG. 4 is a cross-sectional side view of a semiconductor package including a support structure having a die with a relatively large surface area disposed on the support structure, according to one embodiment of the present invention.

FIG. 4 shows a cross-sectional side view of a semiconductor package 24, according to another embodiment of the present invention. Semiconductor package 24 includes a support structure 14 that has a second die 16 with a relatively large horizontal area disposed on top side 14c of support structure 14. The horizontal area of second die 16 is greater than the horizontal area of first die 12. An advantage of this embodiment is that it allows a large second die 16 to be stacked above a small first die 12, while providing clearance for bond wires 18 and thermal protection for the pair of dies.

Figure 5A:
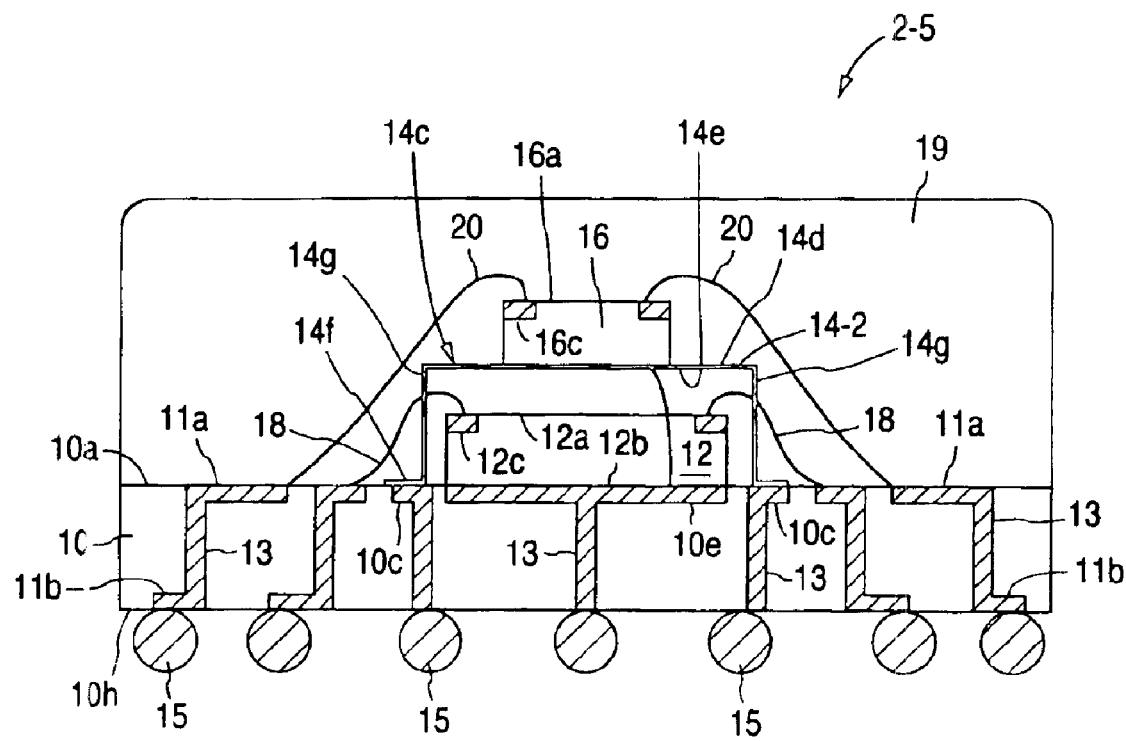
FIG. 5A is a cross-sectional side view of a semiconductor package including a support structure having a plurality of legs, according to one embodiment of the present invention.
Figure 5B:
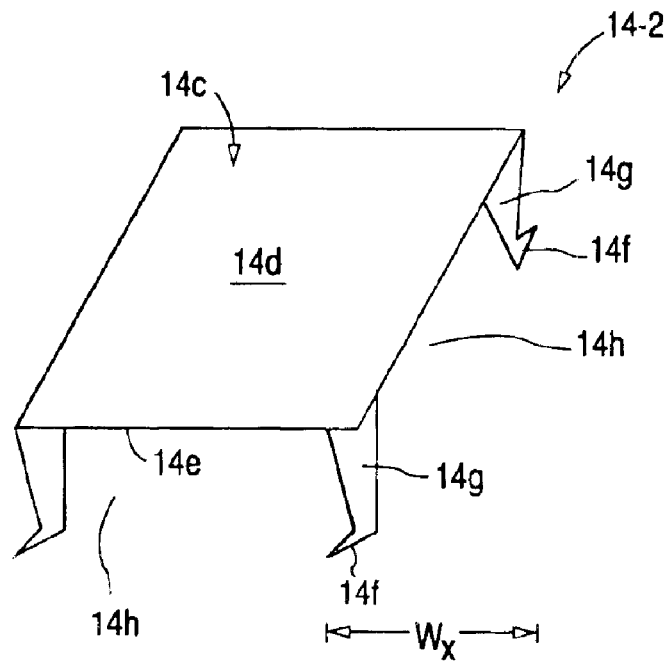
FIG. 5B is a perspective view of the support structure of FIG. 5A.

FIG. 5A is a side view of a semiconductor package 2-5, including a support structure 14-2, according to another embodiment of the present invention. FIG. 5B is a perspective view of support structure 14-2. Support structure 14-2 has a vertical leg 14g at each of the four corners of top side 14c of support structure 14-2. Each leg has a horizontally extending foot 14f that is thermally coupled to conductive portion 10c of substrate 10. Opening 14h is between adjacent legs 14g. Bond wires 18 may be electrically connected between the bond pads 16c of first die 12 and respective first circuit patterns 11a on first surface 10a of substrate 10 outside the perimeter of support structure 14-2 through openings 14h between legs 14g. Accordingly, the perimeter of support structure 14-2 and of package 2-5 may be smaller than that of support structure 14 and package 2-1 of FIG. 1, where bond wires 18 are entirely within support structure 14. One or more of the feet 14f also may be electrically connected to a reference voltage (e.g., ground) through a conductive ball 15, via 13, and conductive portion 10c if it is desired to apply such a reference voltage to second surface 16b of second die 16. Although support structure 14-2 is shown having four legs 14g, it should be recognized support structure 14-2 can have any number of legs 14g and openings 14h arranged in any manner.

Package 2-5's feature of having bond wires 18 that extend through openings 14h of support structure 14-2 to a point of connection with first circuit patterns 11a that is outside a perimeter of support structure 14-2 may be used with the other packages disclosed herein, such as, for example, package 2-3 and the packages discussed below.

Figure 6A:
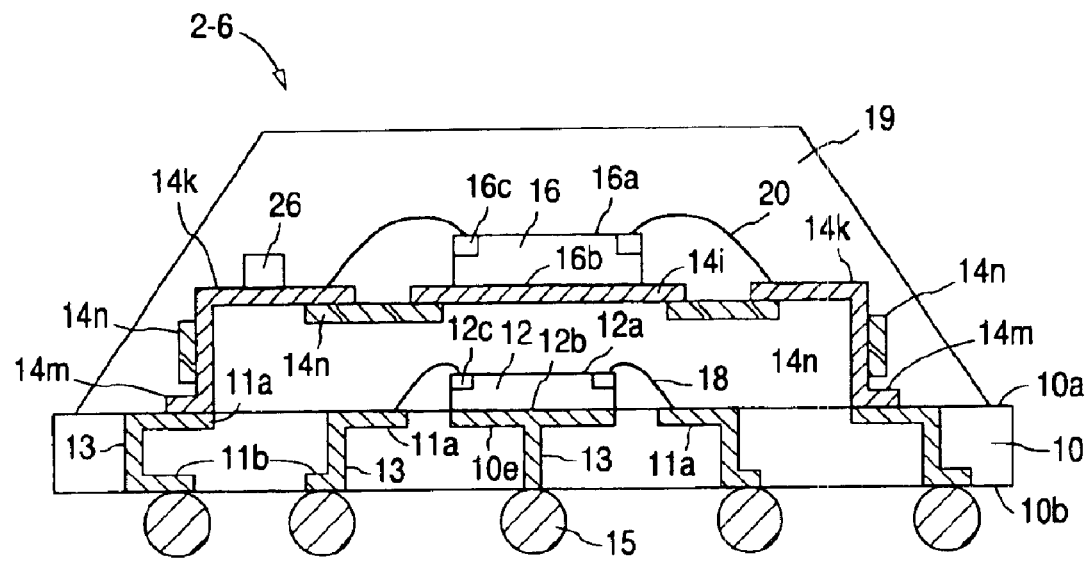
FIG. 6A is a cross-sectional side view of a semiconductor package including a leadframe support structure, according to one embodiment of the present invention.
Figure 6B:
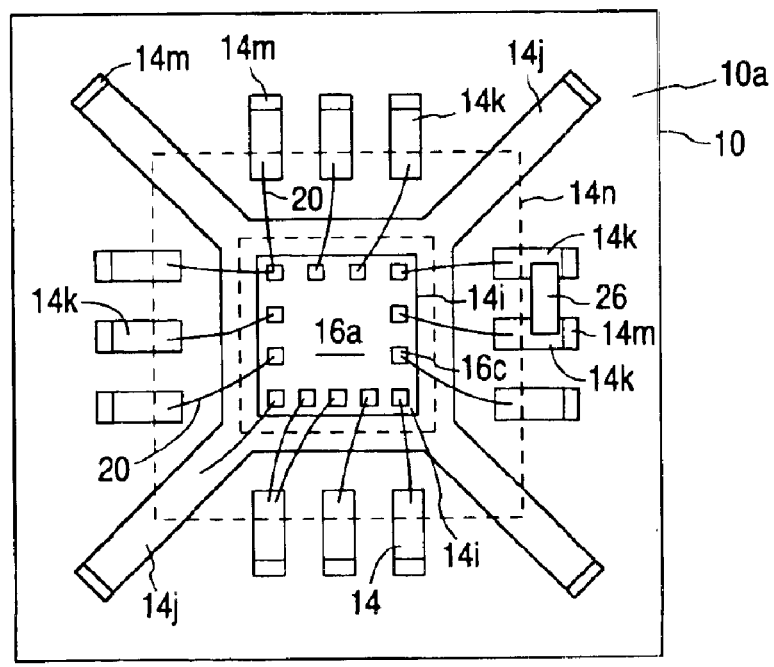
FIG. 6B is a partially broken top plan view of the semiconductor package of FIG. 6A.

FIGS. 6A and 6B are a cross-sectional side view and a partially broken top plan view, respectively, of a semiconductor package 2-6, according to another embodiment of the present invention. Semiconductor package 2-6 includes a metal support structure 14-3 that is patterned like a leadframe. Referring to FIG. 6B, support structure 14-3 includes a rectangular metal central die pad 14i supported by four metal tie bars 14j that extend integrally from each of the four corners of die pad 14i. A plurality of metal leads 14k extend radially outward from each of the fours sides of die pad 14i. Leads 14k and tie bars 14j are each bent downward at a steep angle or a right angle and then bent to form horizontal feet 14m. Feet 14m of leads 14k are each electrically connected, e.g., by solder, to a first circuit pattern 11a on first surface 10a of substrate 10. Bond wires 20 electrically connect bond pads 16c of second die 16 to respective leads 14k. Layers of a non-conductive (e.g., polyimide) tape 14n (shown by dashed lines in FIG. 6B) are adhesively applied onto and across the horizontal and vertical portions of leads 14k and tie bars 14j to hold them together until support structure 14-3 is encapsulated within encapsulant 19, which penetrates between the leads 14k to cover first die 12 and fill the volume within support structure 14-3. Accordingly, second die 16 is electrically connected to first circuit pattern 11a through leads 14k. In addition, a voltage source (e.g., ground) may be provided to the backside of a second die 16 through an electrically conductive die attach material and an electrical connection between one or all of the tie bars 14j and a conductive region 10c or a first circuit pattern 11a of substrate 10.

In an alternative embodiment of package 14-6, second die 16 may be mounted in a flip chip style on leads 14k of support structure 14-3. In such embodiment, the bond pads 16c of second die 16 are superimposed over of leads 14k, and are electrically connected thereto with solder or an electrically conductive adhesive. Die pad 14i may or may not be present.

In another alternative embodiment of package 2-6 of FIGS. 6A and 6B, second die 16 may be mounted on the opposite, underside of die pad 14i, so that second die 16 and bond wires 20 are entirely within support structure 14-3.

A circuit element 26 optionally may be mounted on leads 14k. Input/output terminals on circuit element 26 are electrically connected between a plurality of leads 14k. Circuit element 26 can be a passive circuit element, such as a resistor, a capacitor, or an inductor, or circuit element 26 can be an active circuit element, such as a semiconductor die.

Figure 7A:
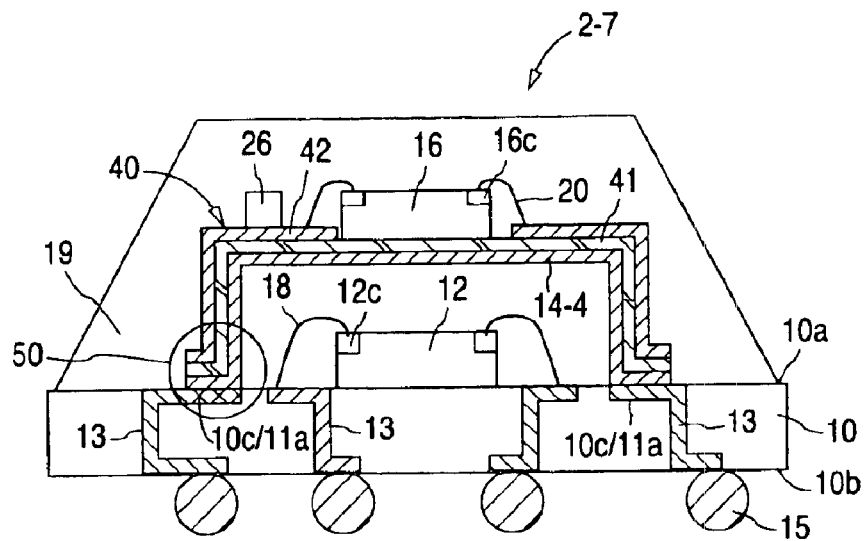
FIG. 7A is a cross-sectional side view of a semiconductor package including a support structure having a circuit film disposed thereon, according to one embodiment of the present invention.

FIG. 7A is a cross-sectional side view of a semiconductor package 2-7, according to another embodiment of the present invention. Semiconductor package 2-7 includes a support structure 14-4, which may be metal or a non-conductive material. A flexible circuit film 40 is disposed on first surface 14d of top side 14c and outer sides 14a, 14b of support structure 14-4. Circuit film 40 may include, for instance, an insulative first layer 41 of polyimide that is attached using an adhesive layer to support structure 14-4, and an overlying layer of conductive (e.g., metal) circuit traces 42. Bond wires 20 are used to electrically connect bond pads 16c of second die 16 to conductive circuit traces 42.

Figure 7B:
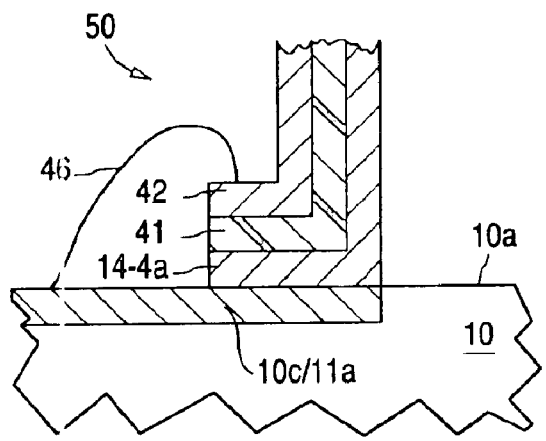
FIGS. 7B, 7C, and 7D are cross-sectional side views of alternate configurations of a circled portion of the semiconductor package shown in FIG. 7A.
Figure 7C:
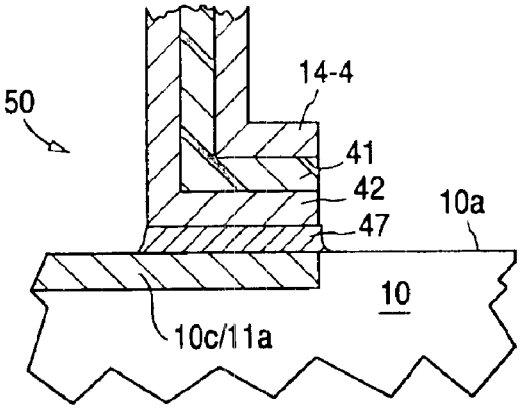
Figure 7D:
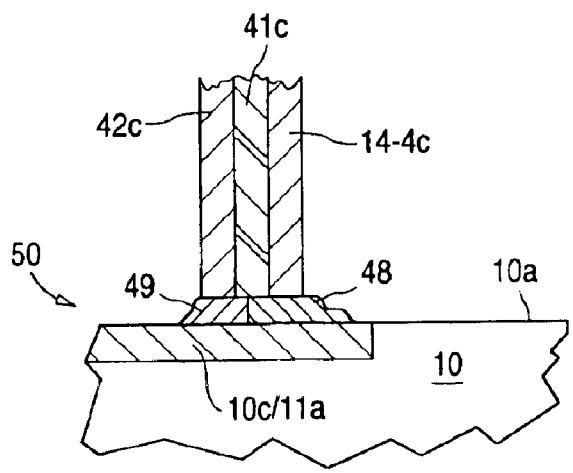

FIGS. 7B, 7C and 7D show circled portion 50 of semiconductor package 2-7 in detail. In particular, FIGS. 7B, 7C and 7D show three different ways by which support structure 14-4 and circuit film 40 can be electrically and mechanically coupled to first surface 10a of substrate 10. In FIG. 7B, support structure 14-4 includes an outwardly bent foot 14-4a over which first layer 41 and circuit traces 42 of circuit film 40 extend horizontally outward. Foot 14-4a of support structure 14-4 can be mechanically, electrically, and/or thermally coupled to juxtaposed conductive regions 10c or circuit patterns 11a of first surface 10a of substrate 10 using any suitable means (e.g., by solder or a conductive adhesive). Conductive circuit traces 42 are each electrically coupled to first circuit patterns 11a of substrate 10 via one of a plurality of bond wires 46.

In FIG. 7C, support structure 14-4 includes an inwardly bent foot 14-4b under which first layer 41 and circuit traces 42 of circuit film 40 extend horizontally inward. Bent portion 42b of conductive circuit traces 42 can be mechanically, electrically, and/or thermally coupled to juxtaposed conductive regions 10c or circuit patterns 11a of first surface 10a of substrate 10 using any suitable connection means 47 (e.g., by solder) disposed between them.

In FIG. 7D, support structure 14-4 includes an end portion 14-4c, first layer 41 includes an end portion 41c, and conductive circuit traces 42 include an end portion 42c, all of which end in a common horizontal plane. End portion 41c of support structure 14-4 can be mechanically, electrically, and/or thermally coupled to juxtaposed conductive regions 10c or circuit patterns 11a of substrate 10 using any suitable means 48 (e.g., by solder or a conductive adhesive). Similarly, end portion 42c of circuit traces 42 can be electrically coupled to circuit patterns 11a of substrate 10 using any suitable means 49 (e.g., by solder or a conductive adhesive).

Referring back to FIG. 7A, circuit element 26 may be disposed on circuit film 40. Input/output terminals on circuit element 26 are electrically connected (e.g., soldered) between a plurality of circuit traces 42. Circuit element 26 can be a passive circuit element, such as a resistor, a capacitor, or an inductor, or circuit element 26 can be an active circuit element, such as a semiconductor die.

In an alternative embodiment of package 2-7 of FIG. 7A, second die 16 is mounted in a flip-chip connection with circuit traces 42 of circuit film 40. Bond pads 16c of second die 16 are juxtaposed with and soldered to the circuit traces 42.

Figure 8:
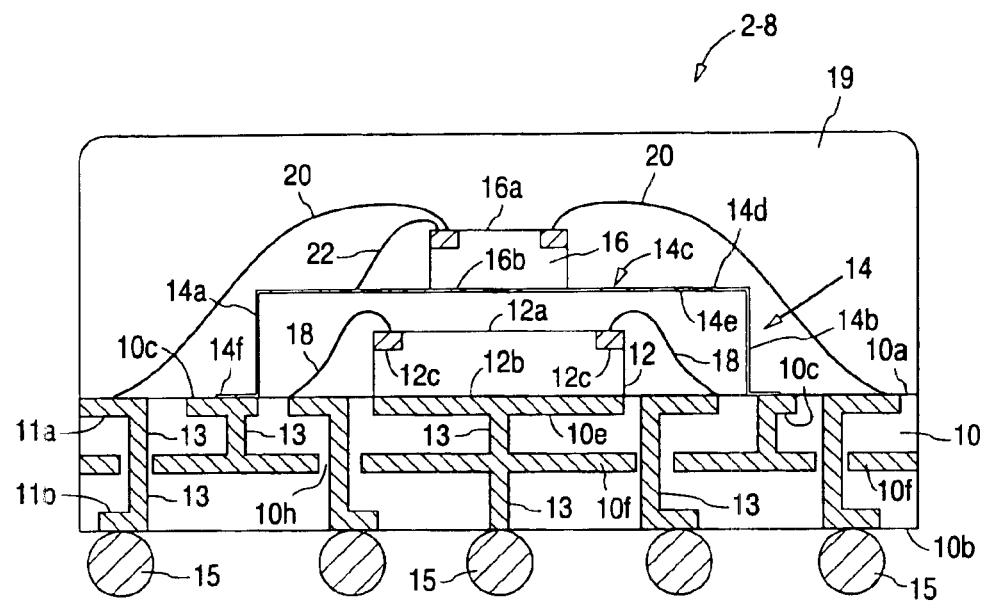
FIG. 8 is a cross-sectional side view of a semiconductor package including a support structure that functions as an electromagnetic interference (EMI) shield, according to one embodiment of the present invention.

FIG. 8 shows a cross-sectional side view of a semiconductor package 2-11, according to another embodiment of the present invention. Semiconductor package 2-11 includes a support structure 14-5 that functions as an electromagnetic interference (EMI) shield. Support structure 14-5 is made of a material (e.g., metal) that is capable of shielding first die 12 from electromagnetic energy generated by second die 16 and other external electromagnetic energy sources. Alternatively, support structure 14-5 may shield second die 16 from electromagnetic energy generated by first die 12. Support structure 14-5 can have a plurality of holes formed through it to allow encapsulant 19 to cover first die 12, or support structure 14-5 can be solid with slots at its base to allow encapsulant 19 to fill the volume within support structure 14-5. In this case, feet 14f of support structure 14-5 are electrically connected through conductive portion 10c and a via 13 to an internal metal thermal and ground plane 10f of substrate 10, which in turn is electrically and thermally connected by another via 13 to one or more conductive balls 15 on second surface 10b of substrate 10. Other vias 13 that conduct signals to and from first die 12 and second die 16 pass through apertures 10h in thermal/ground plane 10f.

Optionally, a bond pad 10c and/or second side 16b of second die 16 may be electrically connected (by a bond wire 20 or a layer of an electrically conductive adhesive, respectively) to a conductive portion of support structure 14, so that second die 16 may be electrically coupled to substrate layer 10f through support structure 14.

Figure 9:
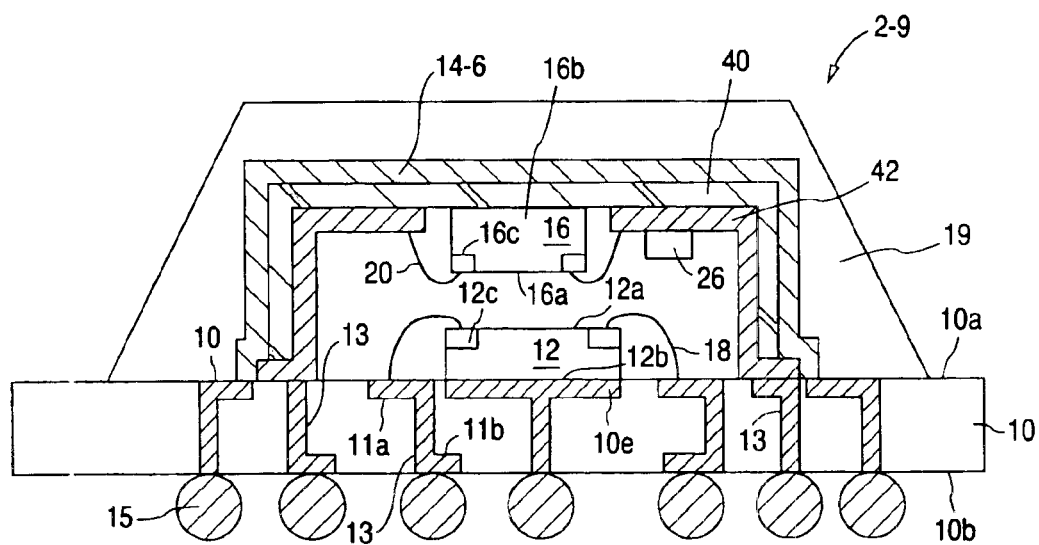
FIG. 9 is a cross-sectional side view of a semiconductor package including a support structure having a die and a circuit element disposed on a circuit film that is on an inside surface of the support structure, according to one embodiment of the present invention.

FIG. 9 shows a cross-sectional side view of a semiconductor package 2-9, according to another embodiment of the present invention Semiconductor package 2-9 includes a support structure 14-6 that has a circuit film 40 and circuit traces 42 on its inside horizontal surface 14e and inner sides 14a, 14b. Bond pads 16c of second die 16 are electrically connected via conductive wires 20 to circuit traces 42. Circuit traces 42 are electrically connected to first circuit patterns 11a of substrate 10, and from there to conductive balls 15 on second surface 10b of substrate 10. Optional circuit element 26 may be mounted on circuit film 40 and electrically coupled across circuit traces 42 thereof. An advantage of this embodiment is that die 16 and circuit element 26 are both protected within support structure 14. Support structure 14-6 and circuit film 40 can be electrically, mechanically, and/or thermally coupled to first surface 10a of substrate 10 in ways similar to those shown in FIGS. 7B, 7C and 7D.

Figure 10:
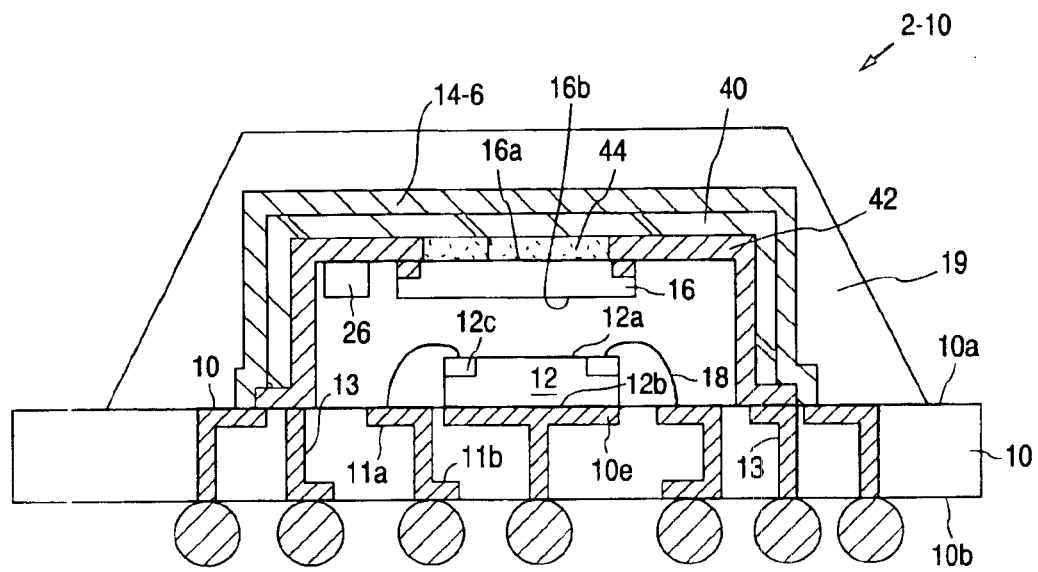
FIG. 10 is a cross-sectional side view of a semiconductor package including a support structure having a flip chip die and a circuit element disposed on a circuit film that is on an inside surface of the support structure, according to one embodiment of the present invention.

FIG. 10 is a cross-sectional side view of a semiconductor package 2-10, according to another embodiment of the present invention. Semiconductor package 2-10 includes a support structure 14-6, as in package 2-9 of FIG. 9, that has a second die 16 and a circuit element 26 mounted on circuit traces 42 of a circuit film 40 on inside surface 14e of support structure 14. Semiconductor package 2-10 is similar to semiconductor package 2-9, except that second die 16 is a flip-chip. Bond pads 16c of second die 16 and circuit element 26 are electrically connected to circuit traces 42 of circuit film 40 by reflowed conductive balls. An adhesive insulative underfill material 44 may be provided between first surface 16a of second die 16 and circuit film 40. Support structure 14-6 and circuit film 40 can be electrically, mechanically, and/or thermally coupled to substrate 10 in ways similar to those shown in FIGS. 7B, 7C and 7D.

Figure 11:
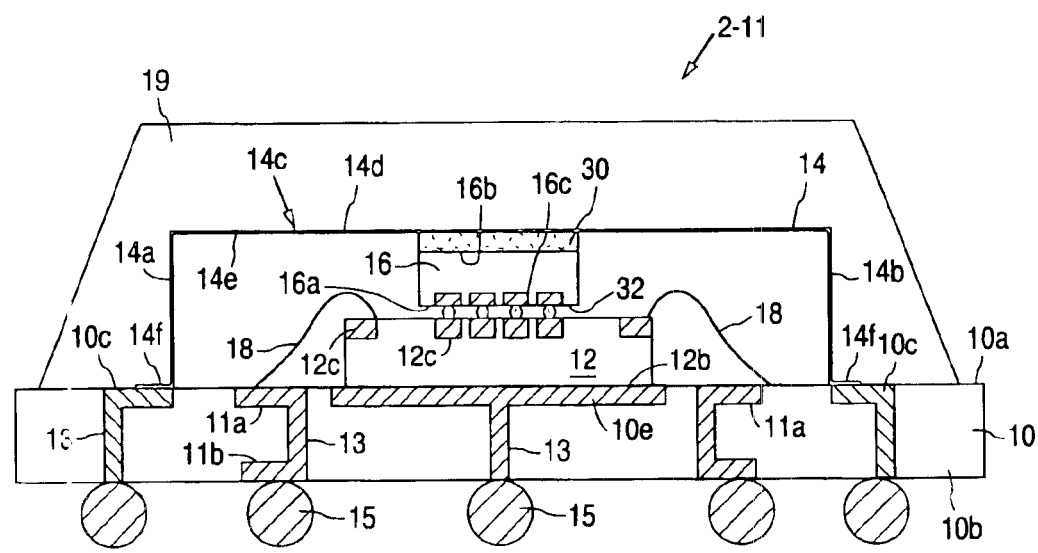
FIG. 11 is a cross-sectional side view of a semiconductor package including a support structure that superimposes two dies, according to one embodiment of the present invention.

FIG. 11 is a cross-sectional side view of a semiconductor package 2-11, according to another embodiment of the present invention. Semiconductor package 2-11 includes a support structure 14 that superimposes both first die 12 and second die 16. Inside second surface 14e of top side 14c of support structure 14 is thermally coupled to inactive second surface 16b of second die 16 via a thermal coupling means 30. Coupling means 30 can be an adhesive material that is thermally conductive and electrically insulative, such as a thermally conductive die attach paste or film. Accordingly, second die 16 can be thermally coupled through support structure 14 to a heat sink of substrate 10. Alternatively, coupling means 30 can be a material that is thermally conductive and electrically conductive. In such an embodiment, where support structure 14 is also electrically conductive (e.g., is metal), a voltage can be applied to inactive second surface 16b of second die 16 through support structure 14.

Second die 16 is in a flip chip connection with first die 12. In particular, bond pads 16c on active first surface 16a of second die 16 are electrically connected by conductive balls 28 to corresponding centrally-located bond pads 12c on active first surface 12a of first die 12. Peripheral bond pads 12c of first die 12 are electrically connected by bond wires 18 to first circuit patterns 11a. An advantage of this embodiment is that support structure 14 provides a thermal path (and potentially a grounding path) from second die 16 to substrate 10. Thus, heat generated by second die 16 will flow from second die 16 through support structure 14 into substrate 10.

Figure 12A:
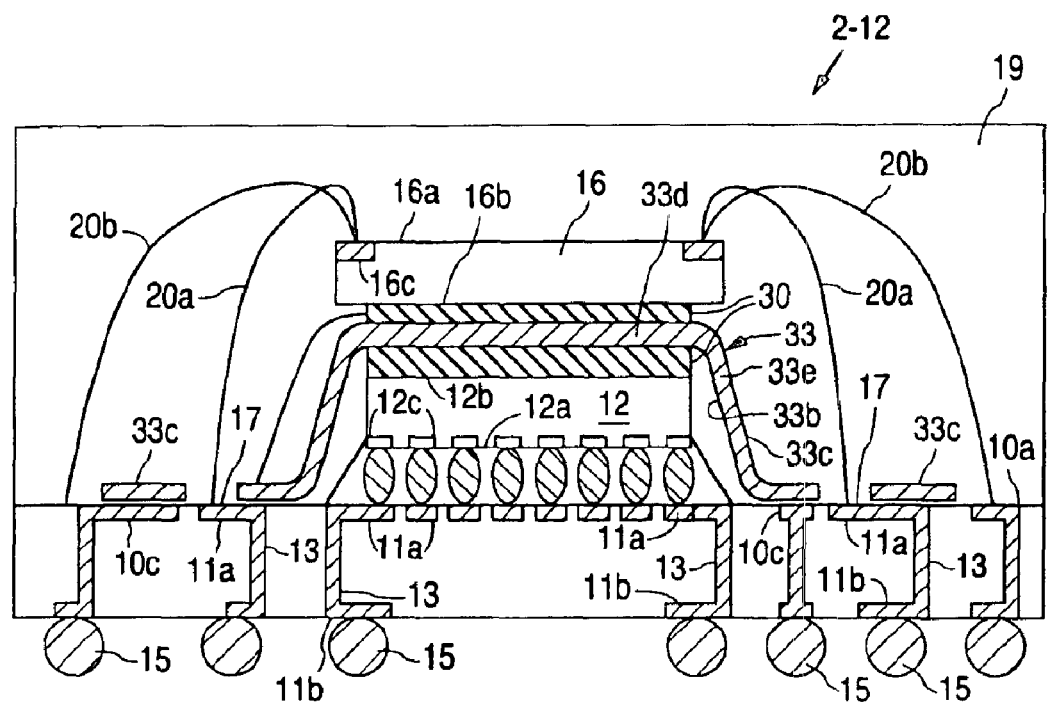
FIG. 12A is a cross-sectional side view of a semiconductor package including a heat spreader that is between and coupled to a pair of dies, according to one embodiment of the present invention.
Figure 12B:
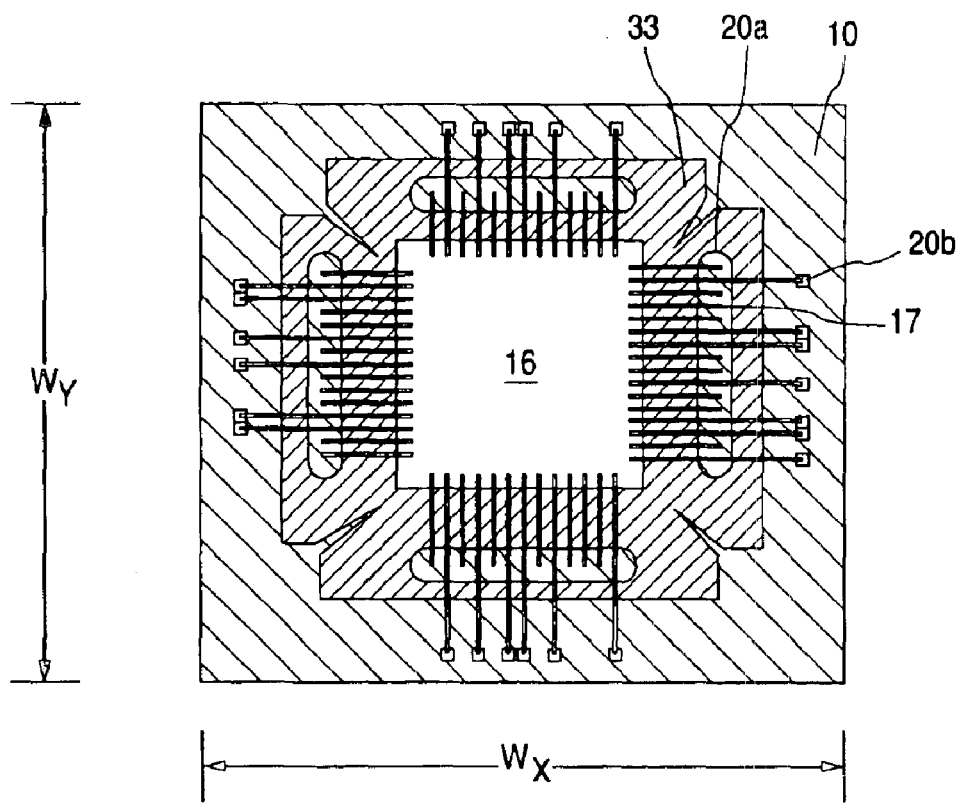
FIG. 12B is a top plan view of the semiconductor package of FIG. 12A.

FIGS. 12A and 12B are a cross-sectional view and a top plan view, respectively, of a semiconductor package 2-12, according to another embodiment of the present invention.

Semiconductor package 2-12 includes a lower first die 12, a heat spreader 33, and an upper second die 16.

Heat spreader 33 can be made out of any material that has a high thermal conductivity. Such materials include copper, silver, aluminum, anodized aluminum, metal alloys, or carbon graphite. A metal heat spreader may be stamped from a thin flexible sheet of metal. Heat spreader 33 can have any shape and the shape of heat spreader 33 can be optimized so that encapsulant 19 flows smoothly through heat spreader 33 and covers first die 12, thereby avoiding voids in encapsulant 19.

Active first surface 12a of first die 12 includes a plurality of bond pads 12c that are respectively electrically coupled to first circuit patterns 11a on first surface 10a of substrate 10 by a plurality of conductive balls 28 in a flip-chip connection. First die 12 and its electrical connections are within a cavity defined by heat spreader 33 and first surface 10a of substrate 10. Active first surface 16a of second die 16 includes a plurality of bond pads 16c that are respectively electrically coupled to a plurality of first circuit patterns 11a on first surface 10a of substrate 10 via a plurality of conductive wires 20a and 20b. First circuit patterns 11a enable first die 12 and second die 16 to be electrically coupled to one another.

Heat spreader 33 has an upper first surface 33a and an opposite lower second surface 33b. Heat spreader 33 is a unitary structure and includes a horizontally-extending peripheral base portion 33c, a horizontal central upper portion 33d, and an inclined vertical intermediate portion 33e between base portion 33c and upper portion 33d. Base portion 33c may be thermally coupled, e.g., by solder or a thermally conductive adhesive, to a conductive portion 10c at first surface 10a of substrate 10. Conductive portion 10c may be thermally coupled by vias 13 through substrate 10 to conductive balls 16 on second surface 10b of substrate 10. Alternatively, substrate 10 may include an internal heat sink layer in a middle portion of substrate 10, to which heat spreader 33 may be thermally coupled by conductive portions 10c and vias 13 (see, e.g., FIG. 8).

Upper surface 33a of heat spreader 33 is thermally coupled to inactive second surface 16b of second die 16 by an adhesive thermal coupling means 30. Second surface 33b of heat spreader 33 is thermally coupled to inactive second surface 12b of first die 12 by an adhesive thermal coupling means 30. Thermal coupling means 30 can be any type of thermally conductive material, such as a thermally conductive adhesive paste or a thermally conductive film-based die attach adhesive. Thermal coupling means 30 may also be electrically conductive, which would allow a reference voltage (e.g., ground) to be applied to second surfaces 12b, 16b through substrate 10 and heat spreader 33.

By virtue of the above-described thermal connections, first and second dies 12 and 16 may be thermally coupled through heat spreader 33 and substrate 10 to conductive balls 15, which in turn can be fused to a heat sink of an external motherboard, thereby allowing heat to flow from first and second dies 12 and 16 to the motherboard. Alternatively, heat from first and second dies 12 and 16 can be provided to an internal heat sink of substrate 10.

As mentioned above, second die 16 can be electrically connected to first circuit patterns 11a on first surface 10a of substrate 10 by conductive wires 20a and/or conductive wires 20b. Conductive wires 20b are electrically connected to first circuit patterns 11a beyond the outer ends of base portion 33c of heat spreader 33, i.e., between the perimeter of heat spreader 33 and the perimeter of substrate 10.

Conductive wires 20a are electrically connected to first circuit patterns 11a on first surface 10a of substrate 10 through holes 17 provided in base portion 33c of heat spreader 33. By providing for electrical connections via wires 20a through heat spreader 33, the dimensions (i.e., $W_X$ and $W_Y$) of the semiconductor package 2-12 can be reduced while still allowing many wires 20a, 20b bonds to be electrically connected to second die 16.

Figure 13:
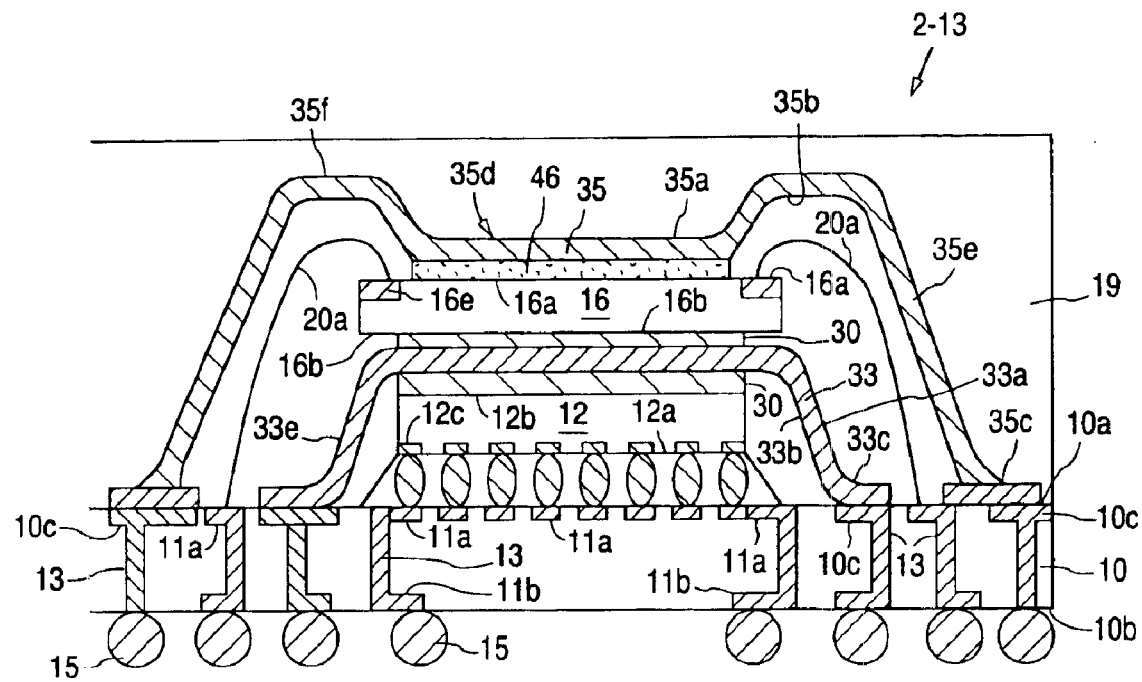
FIG. 13 is a cross-sectional side view of a semiconductor package including a pair of dies and a pair of heat spreaders, according to one embodiment of the present invention.

FIG. 13 shows a cross-sectional view of a semiconductor package 2-13, according to another embodiment of the present invention. Semiconductor package 2-13 is similar to semiconductor package 2-12 of FIGS. 12A and 12B, except that package 2-13 includes a second heat spreader 35.

Heat spreader 35 includes an upper first side 35a, an opposite lower second side 35b, a peripheral base portion 35c, an upper central horizontal portion 35d, and a vertically-inclined intermediate portion 35e. Heat spreader 35 is made of a highly thermally conductive material, e.g., a flexible stamped metal sheet, the same as described above for heat spreader 33. Second surface 35b of horizontal base portion 35c of heat spreader 35 is thermally coupled to first surface 33a of base portion 33c of heat spreader 33, which in turn is thermally coupled to another conductive region 10c of first surface 10a of substrate 10.

Heat spreader 35 is a means for further cooling of second die 16. In particular, second surface 35b of central horizontal portion 35d of heat spreader 35 is thermally coupled by an adhesive thermally conductive, electrically insulative coupling means 46, e.g., a carbon-filled epoxy material, to active first surface 16a of second die 16. Central horizontal portion 35d contacts first surface 16a within a perimeter defined by bond pads 16c of second die 16. Conductive wires 20 are electrically connected to bond pads 16c. Heat spreader 35 has an apex portion 35f which provides clearance for the apex of conductive wires 20. Wires 20 may be bonded in a low loop height style. Accordingly, heat spreader 35 superimposes the stack of first and second dies 12 and 16 and wires 20. Typically, heat spreaders 33 and 35 are provided with openings in intermediate portions 33c and 35e through which encapsulant 19 can penetrate to cover first and second dies 12 and 16 and fill the volumes within heat spreaders 33, 35.

It should be recognized that a third semiconductor die can be electrically and thermally connected to first surface 35a of central portion 35d of heat spreader 35 over second die 16 using the various coupling means discussed above. It should also be recognized that a different number of heat spreaders and dies can be stacked (e.g., three heat spreaders and four dies) in accordance with the present invention.

Figure 14:
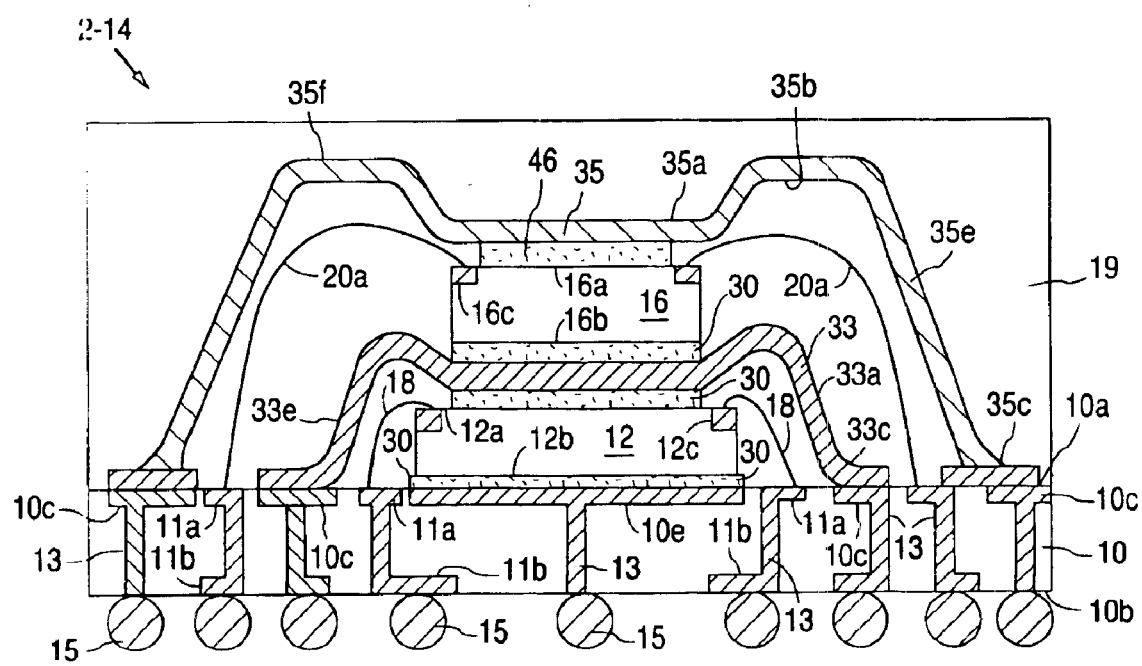
FIG. 14 is a cross-sectional side view of a semiconductor package including a pair of dies and a pair of heat spreaders, according to one embodiment of the present invention.

In an alternative embodiment shown in FIG. 14, first die 12 of package 2-14 is not flip chip bonded, but rather is inverted so that inactive second surface 12b of first die 12 is thermally coupled to a die pad 10e by a coupling means 30, and bond pads 12c are electrically coupled to first circuit patterns 11a through bond wires 8. In such an embodiment, first heat spreader 33 is formed like second heat spreader 35 of FIG. 13. In particular, an apex 33f is provided in heat spreader 33 to provide clearance for low loop bond wires 18, akin to apex 35f of heat spreader 35, and a horizontal central portion 33d of first heat spreader 33 is thermally coupled between a central portion of first surface 12a of first die 12 and second surface 16b of second die 16 by a pair of thermal coupling means 30.

Figure 15:
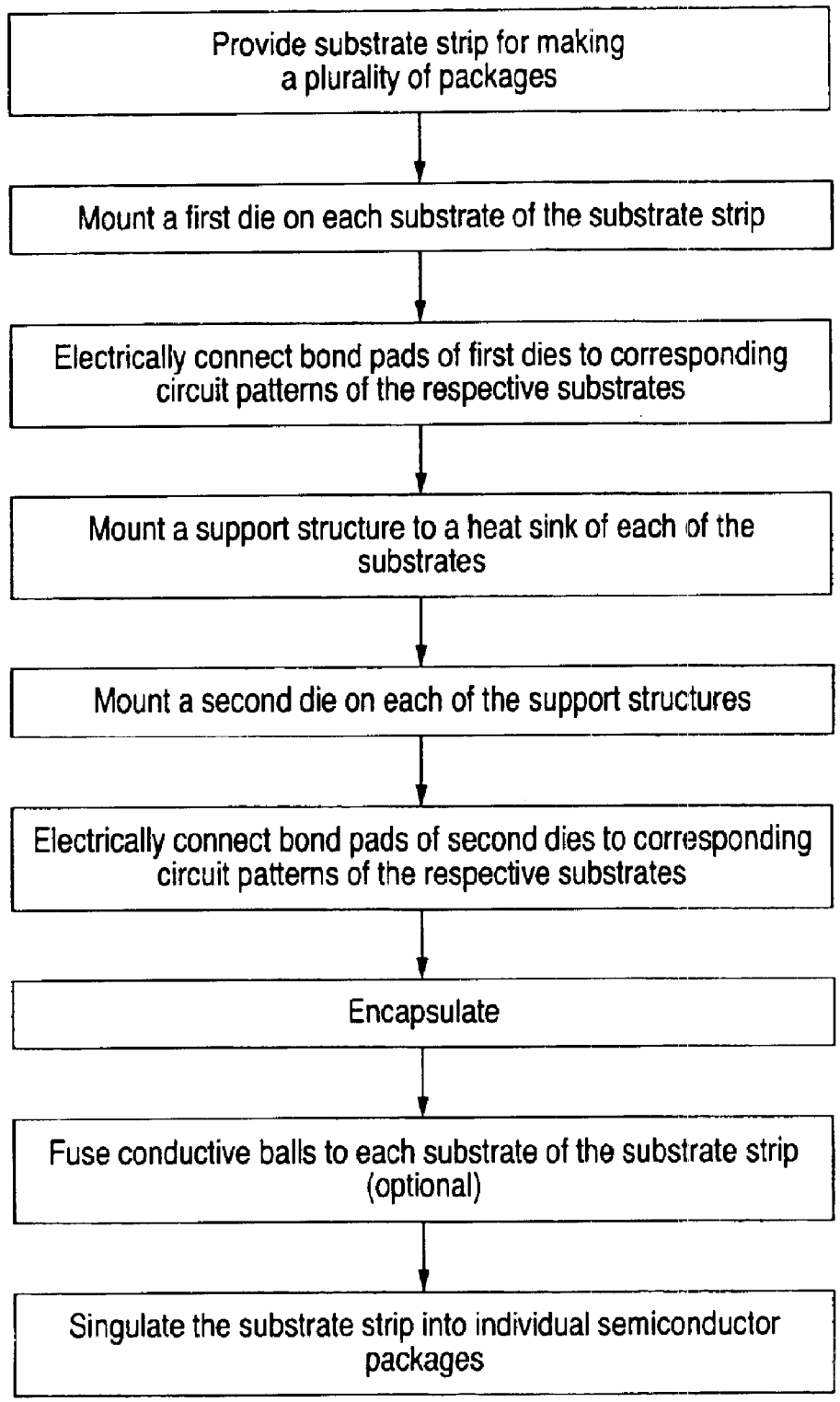
FIG. 15 is a flow chart illustrating an exemplary semiconductor fabrication method, according to one embodiment of the present invention.

FIG. 15 is a flow chart illustrating an exemplary semiconductor fabrication method 200, according to one embodiment of the present invention. Method 200 will be described in the context of semiconductor package 2-1 of FIG. 1 although it should be recognized that similar methods may be employed, with appropriate modifications, to make the other semiconductor packages described above.

In step 202, a substrate strip for making a plurality of packages 2-1 is provided. The substrate strip includes a single row or a two dimensional array of interconnected substrates 10, which ultimately will be cut apart as a final assembly step. Each of the interconnected substrates includes a die pad 10e, first circuit patterns 11a, vias 13, second circuit patterns 11b, and conductive regions 10c, as described above. Alternatively, single substrates 10 can be processed individually. Each single substrate 10 can be carried in a substrate carrier, sometimes referred to as a "boat," through the assembly process.

In step 204, a first die 12 is mounted on the die pad 10e of first surface 10a of each of the substrates 10 of the substrate sheet. First die 12 can be mounted on die pad 10e, using any suitable technique such as by applying a thermally conductive adhesive to die pad 10e, placing first die 12 onto the adhesive, and then curing the adhesive.

In step 206, the bond pads 12c of each first die 12 are each electrically connected to respective first circuit patterns 11a of the respective substrate 10. The electrical connections may be made via conductive wires 18 (see FIG. 1). Conductive wires 18 can be gold, copper, or aluminum wires, among other possibilities.

In step 208, a support structure 14 is mounted on first surface 10a of each substrate 10 over the first die 12 and in a thermal connection with a heat sink of substrate 10. Referring to FIG. 1, support structure 14 may have horizontal feet 14f that rest on first surface 10a of substrate 10, or support structure 14 can have pins 14g that can be inserted into corresponding holes 10d in first surface 10a. Support structure 14 can be thermally and, if desired, electrically coupled to one or plural conductive regions 10c of first surface 10a of substrate 10 using any suitable technique, such as by soldering or thermal adhesive attachment.

In step 210, a second die 16 is mounted on first surface 14d of top portion 14c of the support structure 14 on each of the respective substrates 10. Second die 16 can be mounted on first surface 14a of support structure 14 using any suitable technique, such as by applying a thermally conductive adhesive to first surface 14a, placing second surface 16b of the second die 16 on the adhesive, and then curing the adhesive. Alternatively, the thermal adhesive may be pre-applied to second die 16.

In step 212, the bond pads 16c of each of the second dies 16 are each electrically connected to first circuit patterns 11a on first surface 10a of the respective substrate 10. The electrical connections are made via conductive wires 20, which may be, gold, copper or aluminum wires.

In step 214, a protective, insulative encapsulant 19 is provided over each of the substrates 10 of strip 100. The encapsulant 19 covers second die 16, wires 20, support structure 14, and all or part of first surface 10a of substrate 10. Since supports structure 14 has openings through it, encapsulant 19 also flows through the openings and covers first die 12 and conductive wires 18 and fills the volume within support structure 14. Encapsulant 19 is thus vertically between first die 12 and second die 16. Encapsulant 19 may be, for example, an epoxy resin, and may be applied using molding or liquid encapsulation techniques. A separate cap of encapsulant 19 may be provided over each substrate 10 of the substrate sheet, or a single block of encapsulant 19 may be provided over all of the substrates 10 of the substrate sheet, in which case the encapsulant is cut during a subsequent singulation step.

In step 216, optional conductive balls 15 are fused onto a lower end of the vias 13 or onto second circuit patterns 11b at second surface 10b of the substrates 10. Alternatively, conductive balls 15 may be omitted, as in a land grid array package. Other conductive balls 15 may be thermally coupled to the support structure 14 through a conductive region 10c and a via 13 through substrate 10, so that heat generated by second die 16 may be conducted through support structure 14 and substrate 10 to an external motherboard.

In step 218, individual packages 2-1 are singulated from the substrate sheet using a punch, saw, laser, or the like, that severs the substrate strip into a plurality of semiconductor packages 2-1. Alternatively, a snapable substrate sheet may be used that snaps apart to singulate packages. The singulation step may cut through the encapsulant 19 as well as cutting through the substrate sheet, thereby forming orthogonal package sides (see, e.g., FIG. 1).

The various other packages shown herein may be made by minor variations of the above method. For instance, a method of making package 2-2 of FIG. 2 and package 2-8d of FIG. 8 includes an additional step of electrically connecting support structure 14 to a conductive region 10 on first surface 10a of substrate 10 so that a reference voltage may be provided to second die 16 through wire 22. A method of making 2-4 of FIG. 4 uses a larger second die 16.

Methods of making packages 2-3 and 2-5 use a differently configured support structure, i.e., support structures 14-1 and 14-2, respectively, as discussed above, but otherwise are similar to the method of making package 2-1.

Package 2-6 of FIGS. 6 and 7 includes a metal support structure 14-3 that is patterned like a conventional leadframe, and has layers of an insulative tape to 14n that interconnect and support leads 14k and tie bars 14j. In these packages, second die 16 may be electrically connected to the leads 14k before or after leads 14k are bend at right angles, and before or after support structure 14-3 is mounted on substrate 10.

Packages 2-7 and 2-9 of FIGS. 7 and 9, respectively, include a support structure 14-4, 14-6 that includes a circuit film 40 attached to the support structure. The method of making the package includes additional steps of electrically connecting second die 16 to the respective circuit traces 42 of the circuit film 40 and mounting circuit element 26 (FIG. 9A). A method of making package 2-10 of FIG. 10 uses a flip chip style electrical connection for second die 16, but is otherwise the same as the method of making package 2-9. Second die 16 is mounted before support structure 14-4 is mounted on substrate 10.

A method of making package 2-11 of FIG. 11 requires a first die 12 with both central and peripheral bond pads 12c on first surface 12a. Second die 16 is mounted on the central bond pads 12c in a flip chip connection step, and the peripheral bond pads 12c are connected by wires 18 to first circuit patterns 11a before support structure 14 is mounted on substrate 11. Coupling means 30 is applied to second surface 16b of second die 16 so that a thermal connection can be made between second surface 16b and support structure 14.

A method of making packages 2-12 and 2-13 of FIGS. 12 and 13, respectively, includes electrically coupling first die 12 to first circuit patterns 11a using a flip chip style connection. Further, a heat spreader 33 is provided rather than support structure 14 of FIG. 1. Heat spreader 33 may be mounted on substrate 10 prior to or after mounting of second die 16 on heat spreader 33. A heat spreader 35 subsequently may be attached to second die 16, as in FIG. 13. Package 2-14 of FIG. 14 may be made by altering the above method of electrically connecting first die 12 to substrate 10.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package comprising:

a substrate;

a first die electrically coupled to the substrate;

a second die electrically coupled to the substrate and superimposed over the first die; and a metal heat spreader disposed between the first and second dies, thermally coupled to the first and second dies by respective thermally conductive layers, and thermally coupled to the substrate, wherein the second die is electrically coupled to the substrate through at least one aperture in the heat spreader; and a unitary body of a hardened encapsulant covering the first and second dies and filling an internal cavity of the heat spreader.

2. The semiconductor package of claim 1, wherein the first die is electrically coupled to the substrate in a flip chip connection.

3. The semiconductor package of claim 2, wherein the second die is electrically coupled to the substrate by conductive wires.

4. The semiconductor package of claim 1, wherein the first and second dies are electrically coupled to the substrate by conductive wires.

5. The semiconductor package of claim 1, further comprising a metal second heat spreader superimposed over the first and second dies, and thermally coupled between the second die and the substrate.

6. The semiconductor package of claim 5, wherein the second heat spreader is thermally coupled to an active surface of the second die.

7. The semiconductor package of claim 6, wherein the first die is electrically coupled to the substrate in a flip chip connection.

8. The semiconductor package of claim 7, wherein the second die is electrically coupled to the substrate by at least two conductive wires each of which extends through a respective said aperture in the heat spreader, and by at least one conductive wire that contacts the substrate outward of a perimeter of the heat spreader.

9. The semiconductor package of claim 7, wherein the second die is electrically coupled to the substrate by at least two conductive wires each of which extends through a respective said aperture in the heat spreader.

10. The semiconductor package of claim 5, wherein the first and second dies are electrically coupled to the substrate by conductive wires.

11. The semiconductor package of claim 10, wherein the second die is electrically coupled to the substrate by at least two conductive wires each of which extends through a respective said aperture in the heat spreader.

12. A semiconductor package comprising:

a substrate;

a first die electrically coupled to the substrate;

a second die superimposed over the first die; and a metal first heat spreader, wherein the first heat spreader is thermally coupled between the inactive surface of the first die and the inactive surface of the second die, and is thermally coupled to the substrate, and the second die is electrically coupled to the substrate through at least one aperture in the heat spreader; and a unitary body of a hardened encapsulant covering the first and second dies and filling an internal cavity of the first heat spreader.

13. The semiconductor package of claim 12, wherein the second die is electrically coupled to the substrate by at least two conductive wires each of which extends through a respective said aperture in the heat spreader.

14. The semiconductor package of claim 13, wherein the second die also is electrically coupled to the substrate by at least one conductive wire that does not extend through any aperture in the first heat spreader.

15. The semiconductor package of claim 13, wherein the second die also is electrically coupled to the substrate by at least one conductive wire that contacts the substrate outward of a perimeter of the heat spreader.

16. The semiconductor package of claim 12, further comprising a metal second heat spreader superimposed over the first and second dies, and thermally coupled between the active surface of the second die and the substrate, wherein the encapsulant fills an internal cavity of the second heat spreader.

17. The semiconductor package of claim 12, further comprising a metal second heat spreader superimposed over the first and second dies, and thermally coupled between the active surface of the second die and the substrate.

18. A semiconductor package comprising:

a substrate;

a first die electrically coupled to the substrate by conductive wires;

a second die superimposed over the first die and electrically coupled to the substrate by conductive wires; and a metal first heat spreader, wherein the first heat spreader is thermally coupled between the active surface of the first die and the inactive surface of the second die, and is thermally coupled to the substrate, and the second die is electrically coupled to the substrate through at least one aperture in the heat spreader; and a unitary body of a hardened encapsulant covering the first and second dies and filling an internal cavity of the first heat spreader.

19. The semiconductor package of claim 18, wherein the second die is electrically coupled to the substrate by at least two conductive wires each of which extends through a respective said aperture in the heat spreader.

20. The semiconductor package of claim 19, wherein the second die also is electrically coupled to the substrate by at least one conductive wire that does not extend through any aperture in the first heat spreader.

21. The semiconductor package of claim 19, wherein the second die also is electrically coupled to the substrate by at least one conductive wire that contacts the substrate outward of a perimeter of the heat spreader.

22. The semiconductor package of claim 18, further comprising a metal second heat spreader superimposed over the first and second dies, and thermally coupled between the active surface of the second die and the substrate, wherein the encapsulant fills an internal cavity of the second heat spreader.

23. The semiconductor package of claim 18, further comprising a metal second heat spreader superimposed over the first and second dies, and thermally coupled between the active surface of the second die and the substrate.

24. The semiconductor package of claim 23, wherein the second die is electrically coupled to the substrate by at least two conductive wires each of which extends through a respective said aperture in the heat spreader.

* * * * *

UNITED STATES PATENT AND TRADEMARK OFFICE
CERTIFICATE OF CORRECTION

PATENT NO. : 6,919,631 B1  Page 1 of 1
APPLICATION NO. : 10/771072
DATED : July 19, 2005
INVENTOR(S) : David Albert Zoba It is certified that error appears in the above-identified patent and that said Letters Patent is hereby corrected as shown below:

On the title page, Item 75, delete "Paul Robert Hoffman, Chandler, AZ (US);"

Signed and Sealed this

Tenth Day of February, 2009

JOHN DOLL
*Acting Director of the United States Patent and Trademark Office*